US008835288B2

(12) United States Patent
Nishio et al.

(10) Patent No.: US 8,835,288 B2
(45) Date of Patent: Sep. 16, 2014

(54) METHOD OF MANUFACTURING SILICON CARBIDE SEMICONDUCTOR DEVICE

(75) Inventors: Johji Nishio, Tokyo (JP); Masaru Furukawa, Hyogo (JP); Hiroshi Kono, Kanagawa (JP); Takashi Shinohe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/407,249

(22) Filed: Feb. 28, 2012

(65) Prior Publication Data

US 2013/0065382 A1 Mar. 14, 2013

(30) Foreign Application Priority Data

Sep. 8, 2011 (JP) .................................. 2011-196206

(51) Int. Cl.
| | |
|---|---|
| H01L 21/265 | (2006.01) |
| H01L 21/425 | (2006.01) |
| H01L 21/04 | (2006.01) |
| H01L 29/66 | (2006.01) |
| H01L 29/861 | (2006.01) |
| H01L 29/872 | (2006.01) |
| H01L 29/78 | (2006.01) |
| H01L 29/06 | (2006.01) |
| H01L 29/16 | (2006.01) |

(52) U.S. Cl.
CPC .......... *H01L 21/046* (2013.01); *H01L 29/6606* (2013.01); *H01L 29/0619* (2013.01); *H01L 29/8613* (2013.01); *H01L 29/1608* (2013.01); *H01L 29/66068* (2013.01); *H01L 29/0661* (2013.01); *H01L 29/872* (2013.01); *H01L 29/0615* (2013.01); *H01L 29/7802* (2013.01); *H01L 21/045* (2013.01); *H01L 21/049* (2013.01)
USPC ............ 438/516; 438/518; 438/522; 438/530

(58) Field of Classification Search
USPC .................................. 438/518, 516, 522, 530
See application file for complete search history.

(56) References Cited

U.S. PATENT DOCUMENTS

| | | | | |
|---|---|---|---|---|
| 8,097,530 | B2 * | 1/2012 | Nakamura | 438/522 |
| 2002/0052124 | A1 * | 5/2002 | Raaijmakers et al. | 438/778 |
| 2004/0171204 | A1 * | 9/2004 | Slater et al. | 438/200 |
| 2005/0052124 | A1 * | 3/2005 | Hieda et al. | 313/504 |
| 2008/0318400 | A1 * | 12/2008 | Nakamura | 438/522 |
| 2011/0095304 | A1 * | 4/2011 | Abagnale et al. | 257/77 |

FOREIGN PATENT DOCUMENTS

| | | |
|---|---|---|
| JP | 2006-156478 | 6/2006 |
| JP | 2006-344942 | 12/2006 |
| JP | 2009-4571 A | 1/2009 |
| JP | 2009-266969 A | 11/2009 |
| JP | 2010-171417 A | 8/2010 |
| JP | 2012-124263 A | 6/2012 |

OTHER PUBLICATIONS

Office Action issued May 7, 2014 in Japanese Patent Application No. 2011-196206 with English language translation.

* cited by examiner

*Primary Examiner* — Charles Garber
*Assistant Examiner* — Ron Pompey
(74) *Attorney, Agent, or Firm* — Oblon, Spivak, McClelland, Maier & Neustadt, L.L.P.

(57) ABSTRACT

A method of manufacturing a silicon carbide semiconductor device of an embodiment includes: implanting ions in a silicon carbide substrate; performing first heating processing of the silicon carbide substrate in which the ions are implanted; and performing second heating processing of the silicon carbide substrate for which the first heating processing is performed, at a temperature lower than the first heating processing.

23 Claims, 3 Drawing Sheets

METHOD OF MANUFACTURING SILICON CARBIDE SEMICONDUCTOR DEVICE

CROSS-REFERENCE TO RELATED APPLICATION

This application is based upon and claims the benefit of priority from Japanese Patent Applications No. 2011-196206, filed on Sep. 8, 2011; the entire contents of which are incorporated herein by reference.

FIELD

Embodiments described herein relate generally to a method of manufacturing a silicon carbide semiconductor device.

BACKGROUND

With a silicon carbide power semiconductor, a high channel mobility is required to reduce resistance at a channel portion in order to realize low on-resistance. Hence, it is indispensable to suppress the interface state low in the interface between silicon carbide and silicon dioxide. Further, it is necessary to decrease contact resistance in a source region.

It is demanded to increase the activation rate of these implanted ion species to reduce contact resistance with an electrode and reduce switching loss. When heating processing is performed at a superhigh temperature such as 1900° C. to 2000° C. to activate implanted ion species, the activation rate is increased by a mechanism which can restore lattice damage upon ion implantation.

However, a processing temperature is superhigh, and therefore that contradicting negative influences (hereinafter, referred to as "negative influences due to first heating processing") such as sublimation from a silicon carbide surface and resolution and withdrawal of silicon also cause an increasingly remarkable temperature region causes an influence. When a silicon dioxide film is formed on the surface of silicon carbide for which this heating processing is performed at a superhigh temperature to manufacture a MOSFET, the interface state density in the interface between silicon carbide and silicon dioxide substantially rises. Further, even if various atmosphere processings after formation of an oxide film are executed, there is a new problem that the interface between silicon carbide and silicon dioxide with a low interface state density can no longer be realized.

Furthermore, although, when a Schottky barrier diode is manufactured, it is possible to reduce contact resistance similar to manufacturing of a MOSFET, there is a new problem that a backward leakage current increases.

As is observed upon manufacturing of the above MOSFET or a Schottky barrier diode, while a bipolar PiN diode can reduce contact resistance, there is a new problem that an on-voltage rises.

DETAILED DESCRIPTION

Figure 1:
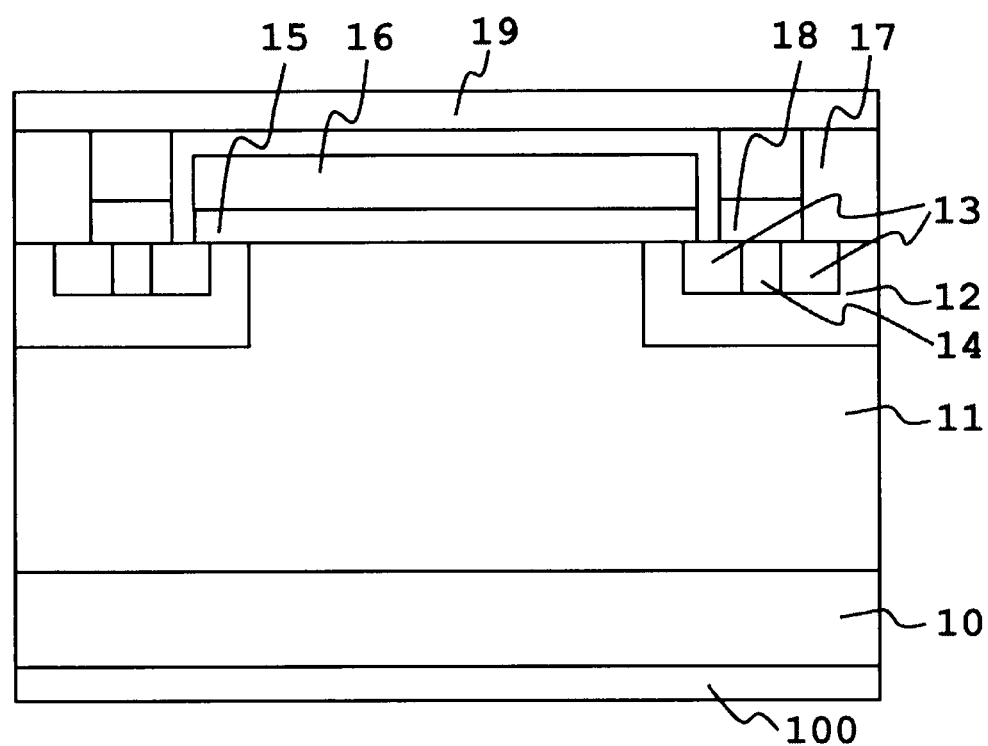
FIG. 1 is a schematic view of a silicon carbide DIMOSFET for describing process of manufacturing a silicon carbide semiconductor device according to a first embodiment.

A method of manufacturing a silicon carbide semiconductor device of an embodiment includes: implanting ions in a silicon carbide substrate; performing first heating processing of the silicon carbide substrate in which the ions are implanted; and performing second heating processing of the silicon carbide substrate for which the first heating processing is performed, at a temperature lower than the first heating processing.

Embodiments of the invention will be described below with reference to the drawings.

With the method of manufacturing a silicon carbide semiconductor device according to an embodiment, first heating processing is performed at a superhigh temperature for a silicon carbide substrate in which ions are implanted to increase the activation rate of implanted ion species, conductivity control of realizing sufficiently low contact resistance is performed, and second heating processing is then performed at a temperature lower than the temperature in the first heating processing. When, for example, an oxide film or an electrode film is formed, the oxide film or the electrode film is preferably formed after multistage heating processing.

The silicon carbide semiconductor device which performs these processings not only includes implanted ion species of a high activation rate but also provides an effect which cannot be provided without the second heating processing and which is regarded to have relaxed the negative influences due to the first heating processing. This effect brings about a decrease of the interface state density in the interface between the processed surface and an insulating film formed on the processed film in the MOSFET. Further, this effect brings about a decrease of a backward leakage current in the Schottky barrier diode. Furthermore, this effect brings about a decrease of an on-voltage in a bipolar PiN diode.

The inventors have made various investigations to increase the channel mobility in a DIMOSFET. As to a generally and widely studied heating processing method after formation of a gate oxide film, a MOS capacitor is created by changing conditions such as a temperature, an atmosphere and a combination thereof, and the interface state density in the interface between silicon carbide and silicon dioxide is estimated based on a result of measuring capacitance-voltage characteristics according to a High-Low method to evaluate whether heating processing conditions are good or bad, based on the degree of the interface state density. Obviously, although the interface state density changed to some degrees depending on heating processing conditions after formation of an oxide film, conditions which go below 1e11 $cm^{-2} eV^{-1}$ could not be found.

Then, the inventors came to think of increasing a heating processing temperature after formation of an oxide film. However, the glass transition temperature is the upper limit for the oxide film, and therefore it is not possible to substantially increase a heating processing temperature. Then, with a hypothesis that elements which control the rate of the interface state density are controlled by crystal fault on a silicon carbide side, that is, in silicon carbide single crystal, the inventors came to think of performing heating processing before formation of an oxide film. When an interface state density is evaluated by forming a silicon dioxide film by performing activation heating processing at a superhigh temperature after ion implantation, then cooling the temperature to a room temperature once and performing oxidation, even though the interface state density was predicted to some degrees, an interface state density is higher more than expected. Although the same estimation is carried out by decreasing an activation heating processing temperature to 1900° C. and creating an oxidized target object, an interface state of about 1e13 cm$^{-2}$ eV$^{-1}$ is estimated. Then, the inventors conducted for a trial an experiment of gradually decreasing a heating processing temperature. When an interface state density is evaluated by creating respective MOS capacitors, a result which goes below 1e11 cm$^{-2}$ eV$^{-1}$ is obtained from a target object for which a heating processing temperature is decreased to 1700° C. However, the activation heating processing temperature of this level provides implanted ion species of a low activation rate, and therefore it was not possible to obtain good contact characteristics from an evaluation based on TLM (Transmission Line Method) measurement.

Hence, by performing multistage heating processing of, first, performing first heating processing at 1800° C. or more and 2000° C. or less as superhigh temperature heating processing of improving contact characteristics and then decreasing the temperature from the second heating processing of maintaining the temperature once at 1600° C. or more and 1700° C. or less, the above problem is solved. The second heating processing is preferably performed subsequent to the first heating processing.

It is not preferable that, when the temperature is too high in the first heating processing, the above negative influences become remarkable, and therefore this temperature is preferably 2000° C. or less and is more preferably 1950° C. or less. Further, when the temperature in the first heating processing is low, the activation rate of implanted species is low and therefore a low temperature is not preferable, and the temperature is preferably 1800° C. or more and is more preferably 1900° C. or more. A more preferable range preferably provides a more distinct effect resulting from the second heating processing.

The temperatures of the first and second heating processings are different, and therefore cooling processing is performed to transition from the first heating processing to the second heating processing. The time of cooling process takes 15 minutes or more and more preferably takes 30 minutes or more to gradually change a temperature of a semiconductor substrate. When the change of the temperature in transition cooling process is rapid, it is not preferable to introduce thermal stress to a semiconductor substrate. Further, a long time of transition cooling process is not economically preferable.

The temperature of the second heating processing is preferable in a range which reduces the negative influences due to the first heating processing. The specific range of the temperature is 1600° C. or more and 1700° C. or less. For example, a defect density which is the negative influence due to the first heating processing hardly changes, and therefore a processing temperature lower than 1600° C. is not preferable. Further, although, for example, the defect density which is the negative influence due to the first heating processing changes, the change amount is a little, and therefore a processing temperature higher than 1700° C. is not preferable.

The second heating processing is preferably performed for at least 15 minutes or more. By performing processing for 15 minutes or more, it is possible to confirm an effect that an interface defect or a crystal fault which is the negative influence due to the first heating processing decreases. When a processing time is longer, the effect of the second heating processing is more remarkable. Further, to obtain a silicon carbide semiconductor device which includes, for example, the interface state density in a processed surface which goes below 1e11 cm$^{-2}$ eV$^{-1}$, sufficiently low current characteristics and characteristics such as a sufficiently low on-voltage, the time of the second heating processing is preferably 20 minutes or more and is more preferably 30 minutes or more. By performing multistage heating processing according to an embodiment, it is possible to realize substantially lower loss in a silicon carbide power semiconductor device.

It is not preferable that, when a semiconductor device is processed at a temperature higher than an upper limit temperature in the second heating processing after the second heating processing, the effect of the second heating processing decreases.

The first and second heating processings are preferably performed in an inert gas atmosphere such as argon.

Oxidization is performed after ion implantation and the first and second heating processings to create a MOS capacitor. When the interface state density of the created MOS capacitor is estimated based on a result of measuring capacitance-voltage characteristics according to a High-Low method, the interface state density decreased. The inventors took this for that some factors of controlling the interface state density which were included in silicon carbide by the first heating processing and which were caused by the negative influences due to the first heating processing decreased.

Next, a Schottky barrier diode is made by forming a Schottky barrier electrode on a surface of a silicon carbide epitaxial film for which the same multistage heating processing is performed. A result of measuring backward leakage current characteristics of the made diode showed uniquely low leakage current characteristics compared to a conventional method. The inventors took this too for a result that a fine region (defect) decreased which is produced near a surface of the silicon carbide epitaxial film and which is caused by the negative influences due to the first heating processing of, for example, locally decreasing a Schottky barrier height.

Further, a result of making a PiN diode by performing the same multistage heating processing by implanting high concentration Al ions in a silicon carbide epitaxial layered structure of a PiN structure showed that not only on-resistance which is regarded to have been caused following a decrease of contact resistance decreased but also an on-voltage decreased. As to the decrease of the on-voltage in particular, the inventors interpreted that the on-voltage decreased because ion implantation damage (defect) near a high concentration p+ type layer and the negative influences due to the first heating processing decreased, and therefore an implantation efficiency increased.

Hereinafter, details will be described based on an illustrated embodiment. A semiconductor device in the drawings employ a symmetrical configuration, and part of reference numerals are not illustrated.

(First Embodiment)

FIG. 1 is a schematic sectional structural view of a lateral DIMOSFET as an example of a silicon carbide semiconductor device according to a first embodiment.

An n− type epitaxial layer 11 having a lower nitrogen concentration than an n+ type substrate 10 is formed on a primary surface of the substrate 10 which is a (0001) surface of 4H— silicon carbide. On the surface side of the epitaxial layer 11, a plurality of p− type well regions 12 are formed at predetermined intervals. In each well region 12, an n+ type source region 13 is formed by implanting nitrogen ions, and p+ type source region 14 for contact is formed in each source region 13 by implanting aluminum ions.

A gate insulating film 15 made of silicon dioxide is formed on a channel region formed between the well regions 12, and a gate electrode 16 is formed on this gate insulating film 15. The entire surface including the gate insulating film 15 is covered by an inter-layer insulating film 17 made of a silicon dioxide film, and part of this inter-layer insulating film 17 is opened to expose the source region 14. A source electrode 18 is formed on the exposed source region 14, and is electrically connected. A wiring 19 is selectively formed on the inter-layer insulating film 17, and this wiring 19 is electrically connected with the gate electrode 16 and source electrode 18. A drain electrode 100 is formed on a back surface of the silicon carbide substrate 10.

The lateral DIMOSFET according to the first embodiment is manufactured, for example, as follows.

The epitaxial layer 11 doped with an n− type impurity is formed on the n+ type silicon carbide substrate 10. This epitaxial layer 11 is formed by adjusting the flow rate of dopant gas to provide dopant impurity concentration which can realize carrier concentration based on predetermined blocking voltage design using, for example, chemical vapor deposition, and also promoting epitaxial growth of film to provide film thickness based on this design. With the first embodiment, growth conditions are adjusted such that the carrier concentration is $3.9 \times 10^{15}$ cm$^{-3}$ and the film thickness is 26 µm to manufacture a MOSFET having blocking voltage of 3.3 kV. Next, a mask (not illustrated) for forming wells is provided on the surface of the epitaxial layer 11, and p− type impurity ions such as aluminum are implanted to form plural p− type well regions 12. After these wells 12 are formed, the mask (not illustrated) is removed. Subsequently, a mask for forming source region (not illustrated) is provided, and n+ type impurity ions such as nitrogen are implanted to form the n+ type source region 13. Next, a mask for forming contact region is provided, and p+ type impurity ions such as aluminum are implanted to form the p+ type source region 14 for contact.

Next, prior to activation heating processing of the implanted impurity ions, the surface of the silicon carbide substrate 10 is coated with photoresist on which the p+ type source region 14 is formed to protect the surface, prebaking is performed, and carbonizing heating processing is then performed in an inert gas atmospheric flow such as argon at 800° C. for 30 minutes. Then, activation heating processing is performed in inert gas such as argon. The maximum achieving temperature is 1900° C., this temperature is maintained for 5 minutes, the set temperature is decreased to 1700° C., and 1700° C. is maintained for 30 minutes and then is cooled to room temperature to take out the substrate. In this way, so-called DI (Double Implanted) structure formed with the well regions 12 and the source areas 13 and 14 is obtained.

After sufficient rinsing, the surface of the epitaxial layer 11 on which the source regions 13 and 14 are formed is put in an oxidizing furnace, and is oxidized in atmospheric flow including oxidized gas such as oxygen or water and dopant gas such as dinitrogen oxide or ammonia at 1100° C. for 6 hours to form the gate insulating film 15 made of silicon dioxide or, more accurately, an oxynitride film. Polysilicon for the gate electrode 16 is formed on the gate insulating film 15.

Resist coating, exposure, development and dry etching are sequentially performed for the polysilicon layer 16 and the gate insulating film 15 by forming a pattern by photolithography, and the polysilicon layer 16 and the gate insulating film 15 other than the region in which the gate electrode is formed are removed. After pattern formation, the resist is removed and rinsing is performed to form the gate electrode 16 formed with the polysilicon layer 16. In this case, part of the gate electrode 16 is formed to overlap part of the source region 13.

The inter-layer insulating film including the gate electrode 16 and having a good insulating property as a whole is deposited. Although the LP-TEOS (Low Pressure-Tetraethyl Orthosilicate) method is used for the deposition method, other LPCVD methods may be used.

Also in the next process, the source region 14 in the inter-layer insulating film 17 and the gate electrode 16 portion are opened by photolithography, a wiring layer is formed in the entire surface and the pattern is formed in the wiring layer to form the source electrode 18 connected to the surface of the source region 14. Further, a wiring 19 connected with the source electrode 18 and the gate electrode 16 is formed. Next, the drain electrode 100 in ohmic contact with the back surface of the silicon carbide substrate 10 is formed. By this means, the lateral DIMOSFET as illustrated in FIG. 1 is completed.

As a result of measuring electrical characteristics of these devices, the channel mobility is remarkably improved by following the decrease of the interface state density, and on-resistance is remarkably reduced due to, assumably, the decrease of contact resistance in the source electrode portion, and roughness on the surface of the silicon carbide epitaxial layer does not become distinct compared to the conventional method without multistage heating processing according to an embodiment particularly in device forming process.

(Second Embodiment)

Next, an embodiment where a Schottky barrier diode device is manufactured will be described with reference to FIG. 2.

Figure 2:
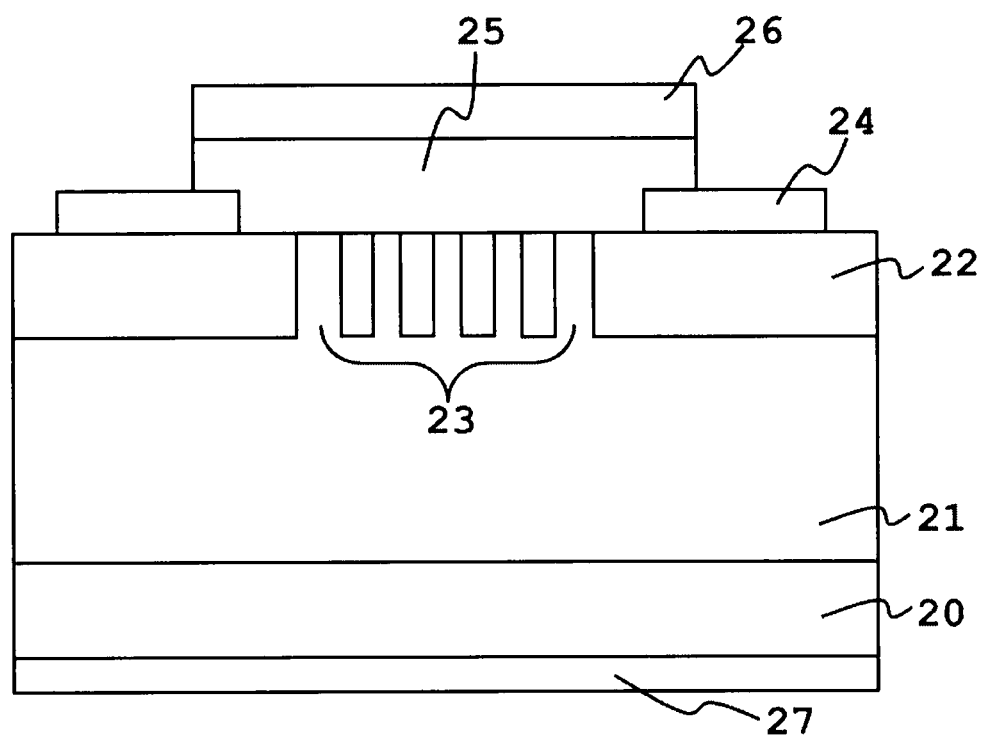
FIG. 2 is a schematic view of a silicon carbide junction barrier Schottky diode for describing process of manufacturing a silicon carbide semiconductor device according to a second embodiment.

FIG. 2 is a schematic sectional structural view of a junction barrier control Schottky (JBS) diode as an example of a silicon carbide semiconductor device according to a second embodiment.

An n− type epitaxial layer 21 having lower nitrogen concentration than an n+ type substrate 20 is formed on a primary surface of the substrate 20 which has (0001) surface of 4H— silicon carbide. On the surface side of the epitaxial layer 21, a p− type region 22 which is a junction terminal structure, and p− type regions 23 for controlling junction barrier are formed. These p− type regions 22 and 23 are formed by implanting aluminum ions.

An oxide film 24 made of silicon dioxide is formed to surround the outer side of the activation region, the center portion of this oxide film 24 is removed and metal (titanium) for Schottky electrode 25 is in contact with the surface of the silicon carbide epitaxial layer 21 to form the Schottky electrode 25. On the upper part of the Schottky electrode 25, anode electrode 26 is formed. On the back surface of the silicon carbide substrate 20, cathode electrode 27 is formed.

The Schottky barrier diode according to the second embodiment is manufactured, for example, as follows.

The epitaxial layer 21 doped with an n− type impurity is formed on the n+ type silicon carbide substrate 20. This epitaxial layer 21 is formed by adjusting the flow rate of dopant gas to provide dopant impurity concentration which can realize carrier concentration based on predetermined blocking voltage design using, for example, chemical vapor deposition, and also promoting epitaxial growth of a film to provide film thickness matching the thickness based on this design. With the second embodiment, growth conditions are adjusted such that the carrier concentration is $3.9 \times 10^{15}$ cm$^{-3}$ and the film thickness is 26 µm to manufacture junction barrier control Schottky diodes of 3.3 kV. Next, a mask (not illustrated) for forming the junction terminal structure is provided on the surface of the epitaxial layer 21, and p− type impurity ions such as aluminum are implanted to form plural p− type well regions 22 and 23. After these regions 22 and 23 are formed, the mask (not illustrated) is removed.

Next, prior to activation heating processing of the implanted impurity ions, the surface of the silicon carbide substrate 20 is coated with photoresist on which the p-type ion implantation regions 22 and 23 are formed to protect the surface, prebaking is performed, and carbonizing heating processing is then performed in inert gas atmospheric flow such as argon at 800° C. for 30 minutes. Then, activation heating processing is performed in inert gas such as argon. The maximum achieving temperature is 1900° C., this temperature is maintained for 5 minutes, the set temperature is decreased to 1700° C., and 1700° C. is maintained for 30 minutes and then is cooled to room temperature to take out the substrate. The junction termination region 22 is formed in this way to obtain higher blocking voltage (field relaxing) structure.

After sufficient rinsing, the surface of the epitaxial layer 21 on which the junction termination region 22 and junction barrier control regions 23 are formed is put in an oxidizing furnace, and is oxidized in dry oxygen atmospheric flow at 1100° C. for 6 hours to form the oxide film 24 made of silicon dioxide.

Resist coating, exposure, development and dry etching are sequentially performed for the oxide film 24 by forming a pattern by photolithography, and the oxide film 24 in a region in which the Schottky electrode is formed is removed. After pattern formation, the resist is removed and rinsing is performed to form the Schottky electrode 25. In this case, part of the Schottky electrode 25 is formed to get on the upper part of the oxide film 24, the anode electrode 26 is subsequently formed on the entire surface of the wafer, and the pattern is formed in the anode electrode layer to form the anode electrode 26 and Schottky electrode 25 as illustrated in FIG. 2. Next, the cathode electrode 27 in ohmic contact with the back surface of the silicon carbide substrate 20 is formed. By this means, a vertical JBS illustrated in FIG. 2 is completed.

Although description has been made as an example using titanium as a Schottky electrode material, the present embodiment can be implemented in the same manner even when another metal material such as tungsten or molybdenum is used, respective Schottky barrier heights change, and therefore, while it is necessary to adjust a design matter such as an interval between p type ion implanted layers of the junction barrier control Schottky structure, titanium is not indispensable to obtain the same effect.

As a result of measuring electrical characteristics of these devices, with backward current-voltage characteristics, substantial leakage current is remarkably suppressed compared to devices made according to the conventional method, so that devices of lower loss can be made.

Although description has been made as an example using titanium as a Schottky electrode, the present embodiment can be implemented in the same manner even when another metal material such as tungsten or molybdenum is used, respective Schottky barrier heights change, and therefore, while it is necessary to adjust a design matter such as an interval between p type ion implanted layers of the junction barrier control Schottky structure, titanium is not indispensable to obtain the same effect.

(Third Embodiment)

Next, an embodiment where a PiN diode is manufactured will be described with reference to FIG. 3.

Figure 3:
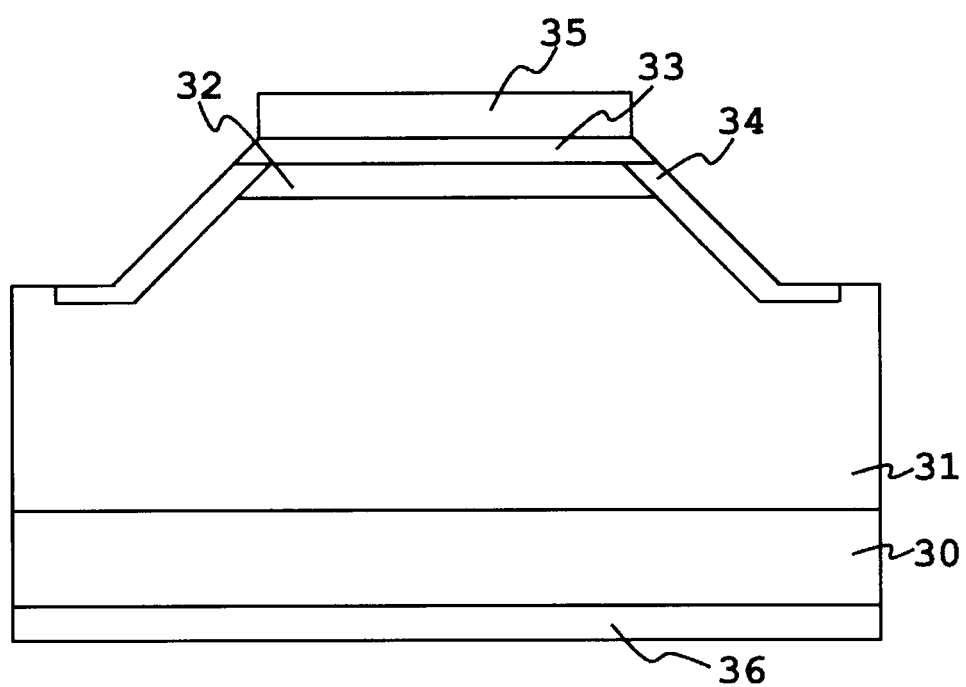
FIG. 3 is a schematic view of a silicon carbide PiN diode for describing process of manufacturing a silicon carbide semiconductor device according to a third embodiment.

FIG. 3 is a schematic sectional structural view of a PiN diode as an example of a silicon carbide semiconductor device according to the third embodiment.

An n− type epitaxial layer 31 having lower nitrogen concentration than the n+ type substrate 30 is formed on a primary surface of the substrate 30 which is the (0001) surface of 4H— silicon carbide. Subsequently, p− type epitaxial layer 32 is formed, and then p+ type epitaxial layer 33 is formed. This layered structure is processed in a mesa shape and is etched until the n− type epitaxial layer 31 is exposed. P− type region 34 which is a junction termination structure is formed on the exposed n− type epitaxial layer 31 and p− type epitaxial layer 32. This p-type region 34 is formed by implanting aluminum ions.

On the upper part of the p+ type epitaxial layer 33, the anode electrode 35 is formed. On the back surface of the silicon carbide substrate 30, the cathode electrode 36 is formed.

The PiN diode according to the third embodiment is manufactured, for example, as follows.

On the n+ type silicon carbide substrate 30, the epitaxial layer 31 doped with n− type impurity, the epitaxial layer 32 doped with p− type impurity and the epitaxial layer 33 doped with p+ type impurity are formed. These epitaxial layers 31, 32 and 33 are formed by adjusting the flow rate of dopant gas to provide the dopant impurity concentration which can realize the carrier concentration based on the predetermined blocking voltage design using, for example, chemical vapor deposition, and also promoting epitaxial growth of film to provide the film thickness based on this design. With the third embodiment, growth conditions are adjusted such that n type carrier concentration is $3.9 \times 10^{15}$ cm$^{-3}$ and the film thickness is 26 μm to manufacture PiN diodes having blocking voltage of 3.3 kV to promote the n− type epitaxial layer 31, to promote the p− type epitaxial layer 32 in which p type carrier concentration is $8 \times 10^{17}$ cm$^{-3}$ and the film thickness is 1.5 μm, and further to promote the p+ type epitaxial layer 33 in which p type carrier concentration is $1 \times 10^{19}$ cm$^{-3}$ and the film thickness is 0.5 μm. Next, the oxide film of about 3 μm is formed on the surface of the epitaxial layer 33 according to CVD, is etched in a mesa shape by dry etching by providing mesa process mask (not illustrated), and is further continuously etched based on the etching speed calculated in advance even after etching reaches the n-type epitaxial layer 31 to complete the mesa process. Next, p− type impurity ions such as aluminum are implanted to form junction termination portion 34 and form p− type region 34. After the region 34 is formed, the mask (not illustrated) is removed.

Next, prior to activation heating processing of the implanted impurity ions, the surface of the silicon carbide substrate 30 is coated with photoresist on which the p-type ion implantation region 34 is formed to protect the surface, prebaking is performed, and carbonizing heating processing is then performed in inert gas atmospheric flow such as argon at 800° C. for 30 minutes. Then, activation heating processing is performed in inert gas such as argon. The maximum achieving temperature is 1900° C., this temperature is maintained for 5 minutes, the set temperature is decreased to 1700° C., and 1700° C. is maintained for 30 minutes and then is cooled to room temperature to take out the substrate. The junction termination region 34 is formed in this way to obtain a higher blocking voltage (field relaxing) structure.

After sufficient rinsing, the anode electrode 35 is formed on the entire surface of the wafer on the surface of the epitaxial layer 33 on which the junction termination area 34 is formed, and a pattern is formed in this anode electrode layer to form the anode electrode 35 as illustrated in FIG. 3. Next, the cathode electrode 36 in ohmic contact with the back surface of the silicon carbide substrate 30 is formed. By this means, the PiN diode as illustrated in FIG. 3 is completed.

As a result of measuring electrical characteristics of these devices, with backward current-voltage characteristics, the threshold voltage remarkably decreases compared to devices made according to the conventional method, so that PiN diodes of lower loss can be made. The inventors interpreted that the on-voltage is reduced because the implantation efficiency increases as a result of reduction of the ion implantation damage near the high concentration p+ type layer. Further, a lower resistance is realized without deterioration of surface morphology which is a primary reason of decrease of contact resistance of the anode electrode, so that on-resistance is also low compared to devices manufactured according to the conventional method.

While certain embodiments have been described, these embodiments have been presented by the way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a silicon carbide semiconductor device, comprising:
   implanting ions in a silicon carbide substrate;
   performing first heating processing of the silicon carbide substrate in which the ions are implanted; and
   performing second heating processing of the silicon carbide substrate for which the first heating processing is performed, at a temperature lower than the first heating processing,
   wherein a temperature in the second heating processing is 1600° C. or more and 1700° C. or less, and
   wherein the temperature in the first heating is maintained for more than one minute.

2. The method according to claim 1, wherein a temperature in the first heating processing is 1800° C. or more and 2000° C. or less.

3. The method according to claim 1, wherein the first heating processing is performed in an inert gas atmosphere comprising argon or silane.

4. The method according to claim 1, wherein the second heating processing is performed in an inert gas atmosphere comprising argon or silane.

5. The method according to claim 1, wherein the second heating processing is performed subsequent to the first heating processing.

6. The method according to claim 1, wherein time it takes to transition from the first heating processing to the second heating processing is 15 minutes or more.

7. The method according to claim 1, wherein time it takes to transition from the first heating processing to the second heating processing is 30 minutes or more.

8. The method according to claim 1, wherein the second heating processing is performed for at least 15 minutes or more.

9. The method according to claim 1, wherein the second heating processing is performed for at least 20 minutes or more.

10. The method according to claim 1, wherein the second heating processing is performed for at least 30 minutes or more.

11. The method according to claim 1, wherein a temperature in the first heating processing is 1900° C. or more.

12. The method according to claim 1, wherein a temperature in the first heating processing is 1950° C. or more.

13. A method of manufacturing a silicon carbide semiconductor device, comprising:
   implanting ions in a silicon carbide substrate;
   performing first heating processing of the silicon carbide substrate in which the ions are implanted; and
   performing second heating processing of the silicon carbide substrate for which the first heating processing is performed, at a temperature lower than the first heating processing,
   wherein a temperature in the second heating processing is 1600° C. or more and 1700° C. or less,
   wherein the first heating processing is performed for more than one minute, and
   wherein the second heating processing is performed for at least 30 minutes or more.

14. The method according to claim 13, wherein a temperature in the first heating processing is 1800° C. or more and 2000° C. or less.

15. The method according to claim 13, wherein the first heating processing is performed in an inert gas atmosphere comprising argon or silane.

16. The method according to claim 13, wherein the second heating processing is performed in an inert gas atmosphere comprising argon or silane.

17. The method according to claim 13, wherein the second heating processing is performed subsequent to the first heating processing.

18. The method according to claim 13, wherein time it takes to transition from the first heating processing to the second heating processing is 15 minutes or more.

19. The method according to claim 1, wherein time it takes to transition from the first heating processing to the second heating processing is 30 minutes or more.

20. The method according to claim 13, wherein the second heating processing is performed for at least 15 minutes or more.

21. The method according to claim 13, wherein the second heating processing is performed for at least 20 minutes or more.

22. The method according to claim 13, wherein a temperature in the first heating processing is 1900° C. or more.

23. The method according to claim 13, wherein a temperature in the first heating processing is 1950° C. or more.

* * * * *